United States Patent
Bauder et al.

(10) Patent No.: US 9,156,677 B2
(45) Date of Patent: Oct. 13, 2015

(54) SHUNT SWITCH AT COMMON PORT TO REDUCE HOT SWITCHING

(71) Applicant: RF Micro Devices, Inc., Greensboro, NC (US)

(72) Inventors: Ruediger Bauder, Feldkirchen-Westerham (DE); Nadim Khlat, Midi-Pyrenees (FR); Julio Costa, Oak Ridge, NC (US); Jonathan Hammond, Oak Ridge, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 383 days.

(21) Appl. No.: 13/764,324

(22) Filed: Feb. 11, 2013

(65) Prior Publication Data
US 2013/0207714 A1    Aug. 15, 2013

Related U.S. Application Data

(60) Provisional application No. 61/596,930, filed on Feb. 9, 2012.

(51) Int. Cl.
*H03F 1/50* (2006.01)
*B81B 7/00* (2006.01)
*H04W 52/02* (2009.01)

(52) U.S. Cl.
CPC .............. *B81B 7/0022* (2013.01); *H04W 52/02* (2013.01); *Y02B 60/50* (2013.01)

(58) Field of Classification Search
CPC ................ H01H 2059/0027; H01L 2924/1461
USPC .................................................. 327/518, 594
See application file for complete search history.

(56) References Cited

U.S. PATENT DOCUMENTS

| | | | |
|---|---|---|---|
| 7,633,275 B2 | 12/2009 | Leyk et al. | |
| 7,864,491 B1 | 1/2011 | Bauder et al. | |
| 8,334,729 B1 * | 12/2012 | Khlat | ............................. 333/32 |
| 8,653,699 B1 | 2/2014 | Dening et al. | |
| 2014/0015731 A1 * | 1/2014 | Khlat et al. | ................... 343/876 |

OTHER PUBLICATIONS

Baso, Anirban et al., "Leading and Trailing Edge Hot Switching Damage in a Metal Contact RF MEMS Switch," IEEE Transducers 2013, Jun. 16-20, 2013, pp. 514-517.
Rebeiz, Gabriel M., "Chapter 7: MEMS Switch Reliability and Power Handling," RF MEMS Theory, Design, and Technology, Feb. 24, 2003, pp. 185, 204-205, John Wiley & Sons, Inc.

* cited by examiner

*Primary Examiner* — William Hernandez
(74) *Attorney, Agent, or Firm* — Withrow & Terranova, P.L.L.C.

(57) ABSTRACT

Pilot switch circuitry grounds a hot node (an injection node) of a microelectromechanical system (MEMS) switch to reduce or eliminate arcing between a cantilever contact and a terminal contact when the MEMS switch is opened or closed. The pilot switch circuitry grounds the hot node prior to, during, and after the cantilever contact and terminal contact of the MEMS come into contact with one another (when the MEMS switch is closed). Additionally, the pilot switch circuitry grounds the hot node prior to, during, and after the cantilever contact and terminal contact of the MEMS disengage from one another (when the MEMS switch is opened).

22 Claims, 11 Drawing Sheets

SHUNT SWITCH AT COMMON PORT TO REDUCE HOT SWITCHING

RELATED APPLICATIONS

This application claims the benefit of provisional patent application Ser. No. 61/596,930, filed Feb. 9, 2012, the disclosure of which is hereby incorporated herein by reference in its entirety.

FIELD OF THE DISCLOSURE

The present invention relates to microelectromechanical system (MEMS) switches, and in particular to pilot switch circuitry that reduces or eliminates arcing between MEMS switch contacts when the MEMS switch is opened or closed.

BACKGROUND

As electronics evolve, there is an increased need for miniature switches that are provided on semiconductor substrates along with other semiconductor components to form various types of circuits. These miniature switches often act as relays, generally range in size from a micrometer to a millimeter, and are generally referred to as microelectromechanical system (MEMS) switches.

In some applications, MEMS switches are configured as switches and replace field effect transistors (FETs). Such MEMS switches reduce insertion losses due to added resistance, and reduce parasitic capacitance and inductance inherent in providing FET switches in a signal path. MEMS switches are currently being deployed in many radio frequency (RF) applications, such as antenna switches, load switches, transmit/receive switches, tuning switches, and the like. For instance, transmit/receive systems requiring complex RF switching capabilities may utilize a MEMS switch.

With the incorporation of WLAN (wireless local area network) circuitry into smartphones, hot switching is no longer the exception but the rule. Hot switching occurs when a switch is switched (changes state from ON to OFF, or vice versa) while some voltage exists across the switch. Specifically, many modern "smartphones" have at least two antennas: a cellular antenna and a WLAN antenna. Thus, most cycles required of a MEMS contact switch (or other switch) attached to the cellular antenna will have hot switching power due to power received from the WLAN antenna. This hot switching may be fatal to contact switches. Conversely, hot switching occurs in switches connected to the WLAN antenna due to power received from the cellular antenna.

Thus, these two antennas are presently separate but co-located in the handset such that power from one network may be coupled to the adjacent network. The attenuation between these two adjacent radios can conservatively be 5 dB. It must be assumed by component manufacturers that these two radios are in continuous operation for the lifetime of the phone, from 5 to 10 years. The peak power from a WLAN radio is known to be +28.5 dBm. The power incident to all devices directly connected to the cellular radio antenna is therefore +23.5 dBm (after subtracting the 5 dB isolation). This level of power has been shown in characterization to limit the useful lifetime of MEMS contact switches to less than 1e6 cycles. However, the required lifetime number of cycles of such a switch used in an antenna switch exceeds 1e9 cycles and is calculated to be as many as 130 B cycles.

Furthermore, MEMS contact switches are known to have a low tolerance for ESD (electro static discharge) stresses with HBM (human body model) durability not exceeding 150 V in most cases compared to a specification requirement of 250 V. No MEMS contact switch has ever been exposed to the 8 k contact discharge test common to handset ESD reliability requirements. But it is possible that a MEMS contact switch would fail this test even with the typical decoupling capacitor and shunt inductor in place.

Turning to FIGS. 1A and 1B, a MEMS device 10 having a main MEMS switch 12 is illustrated according to the prior art. The main MEMS switch 12 is formed on an appropriate substrate 14. The main MEMS switch 12 includes a cantilever 16, which is formed from a conductive material, such as gold. The cantilever 16 has a first end and a second end. The first end is coupled to the substrate 14 by an anchor 18. The first end of the cantilever 16 is also electrically coupled to a first conductive pad 20 at or near the point where the cantilever 16 is anchored to the substrate 14. Notably, the first conductive pad 20 may play a role in anchoring the first end of the cantilever 16 to the substrate 14 as depicted. The first conductive pad 20 may form a portion of or be connected to a first terminal (not shown) of the main MEMS switch 12.

The second end of the cantilever 16 forms or is provided with a cantilever contact 22, which is suspended over a terminal contact 24 formed or provided by a second conductive pad 26. The second conductive pad 26 may form a portion of or be connected to a second terminal (not shown) of the main MEMS switch 12. Thus, when the main MEMS switch 12 is actuated, the cantilever 16 moves the cantilever contact 22 into electrical contact with the terminal contact 24 of the second conductive pad 26 to electrically connect the first conductive pad 20 to the second conductive pad 26. The main MEMS switch 12 may be encapsulated by one or more encapsulating layers 30, which form a substantially hermetically sealed cavity around the cantilever 16. The cavity is generally filled with an inert gas and sealed in a near vacuum state. Once the encapsulation layers 30 are in place, an overmold 32 may be provided over the encapsulation layers 30.

To actuate the main MEMS switch 12, and in particular to cause the cantilever 16 to move the cantilever contact 22 into contact with the terminal contact 24 of the second conductive pad 26, an actuator plate 28 is formed over a portion of the substrate 14, preferably under the middle portion of the cantilever 16. To actuate the main MEMS switch 12, an electrostatic voltage is applied to the actuator plate 28. The presence of the electrostatic voltage creates an electromagnetic field that effectively moves the cantilever 16 against a restoring force toward the actuator plate 28 from an "open" position illustrated in FIG. 1A to a "closed" position illustrated in FIG. 1B. Likewise, removing the electrostatic voltage from the actuator plate 28 releases the cantilever 16 for return to the open position illustrated in FIG. 1A. As illustrated, the open position occurs when the cantilever contact 22 is out of contact with the terminal contact 24, and the closed position occurs when the cantilever contact 22 comes into contact with the terminal contact 24. Other embodiments may differ.

In light of the electromechanical structure of the main MEMS switch 12, the main MEMS switch 12 cannot provide switching action as fast as typical solid state switches, such as n-type metal-oxide-semiconductor (NMOS) FET switches. The switching time of the main MEMS switch 12 typically depends upon the electromagnetic field applied to the cantilever 16, the mass of the cantilever 16, and the restoring force of the cantilever 16. However, an FET switch may generate higher insertion loss than is generated by the main MEMS switch 12. Moreover, at high power levels in an RF circuit (not shown), parasitic capacitance at the semiconductor junctions of the FET switch may alter RF signals.

During switching events, a difference in potential between the cantilever contact 22 and the terminal contact 24 may cause an electrical arc resulting from an electrical current flowing through normally non-conductive media, such as air. Undesired or unintended electrical arcing may have detrimental effects on the cantilever contact 22 and the terminal contact 24 of the main MEMS switch 12. For instance, as the main MEMS switch 12 is being either actuated to the closed position of FIG. 1B or released to the open position of FIG. 1A, arcing from a difference in potential between the cantilever contact 22 and the terminal contact 24 may cause significant aging, unintended wear and tear, degradation, sticking, or destruction of the cantilever contact 22, the terminal contact 24, or both. Unintended power dissipation through arcing should be limited for optimum contact lifetime of the cantilever contact 22 and the terminal contact 24.

Therefore, it is evident there is a need to reduce the amount of power incident to switches connected to a cellular antenna and particularly to MEMS contact switches which are connected to a cellular antenna in order that their lifetimes can be extended to cover the lifetime cycle requirements for this application and make available their extremely low loss and high linearity.

Decreasing the amount of power incident to these switches minimizes arcing, and thus decreases switch contact aging, degradation, sticking, and destruction. In order to utilize the low loss and high linearity possible with MEMS, some means to attenuate the power must be introduced.

Furthermore, there is a need to provide some improved tolerance in these same MEMS contact switches to ESD stresses which can occur as a result of their installation at the antenna of a mobile handset.

SUMMARY

The present disclosure relates to the addition of a pilot switch shunt branch to a common port (such as a "hot node" or an "RF injection node" of a MEMS contact or other switch) to attenuate power entering the switch through the common port during switching events. If the pilot switch is made in solid state, it can switch quickly and additionally offer ESD protection for the switch network it precedes.

In one embodiment, the pilot switch includes a solid state switch in series with a MEMS switch.

In one embodiment, two MEMS switches are transitioned substantially simultaneously during a period when the pilot switch shunts the hot node to ground.

In one embodiment, two MEMS switches are transitioned sequentially during a period when the pilot switch shunts the hot node to ground.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWINGS

The accompanying figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

Figure 1A:
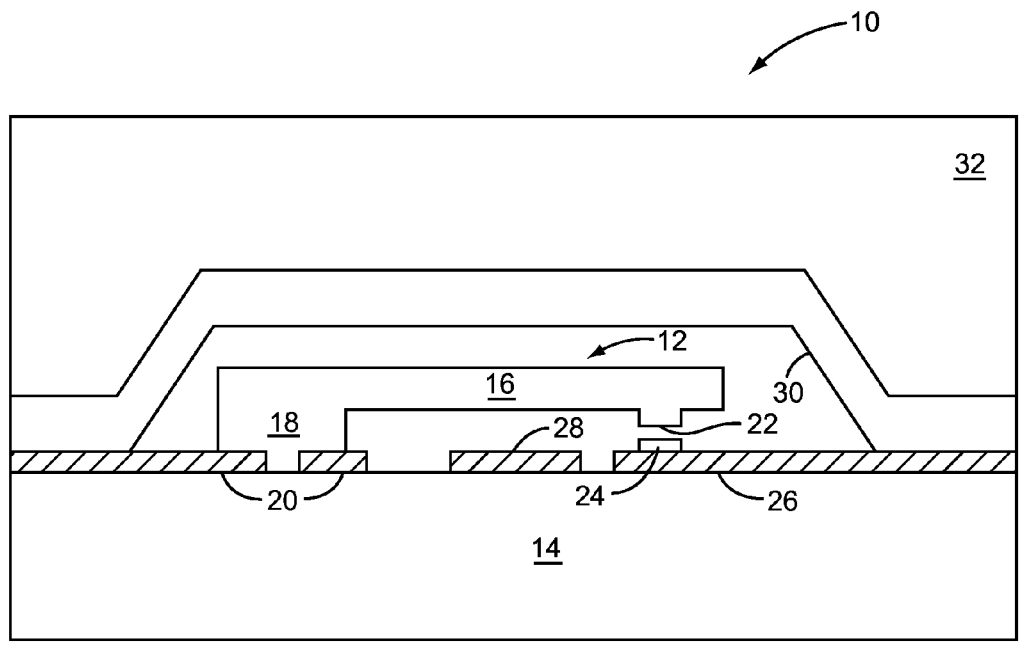
FIGS. 1A and 1B illustrate a microelectromechanical system (MEMS) switch in an open and closed position, respectively, according to the prior art.
Figure 1B:
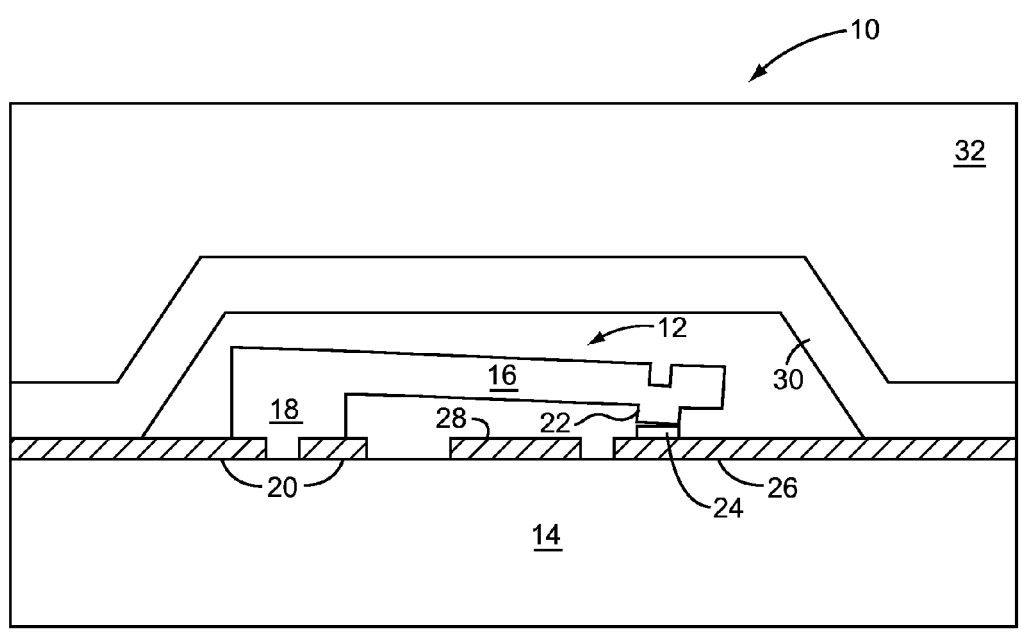

FIGS. 1A and 1B illustrate a microelectromechanical system (MEMS) switch in an open and closed position, respectively, according to the prior art. See Background section for additional discussion.

Figure 2A:
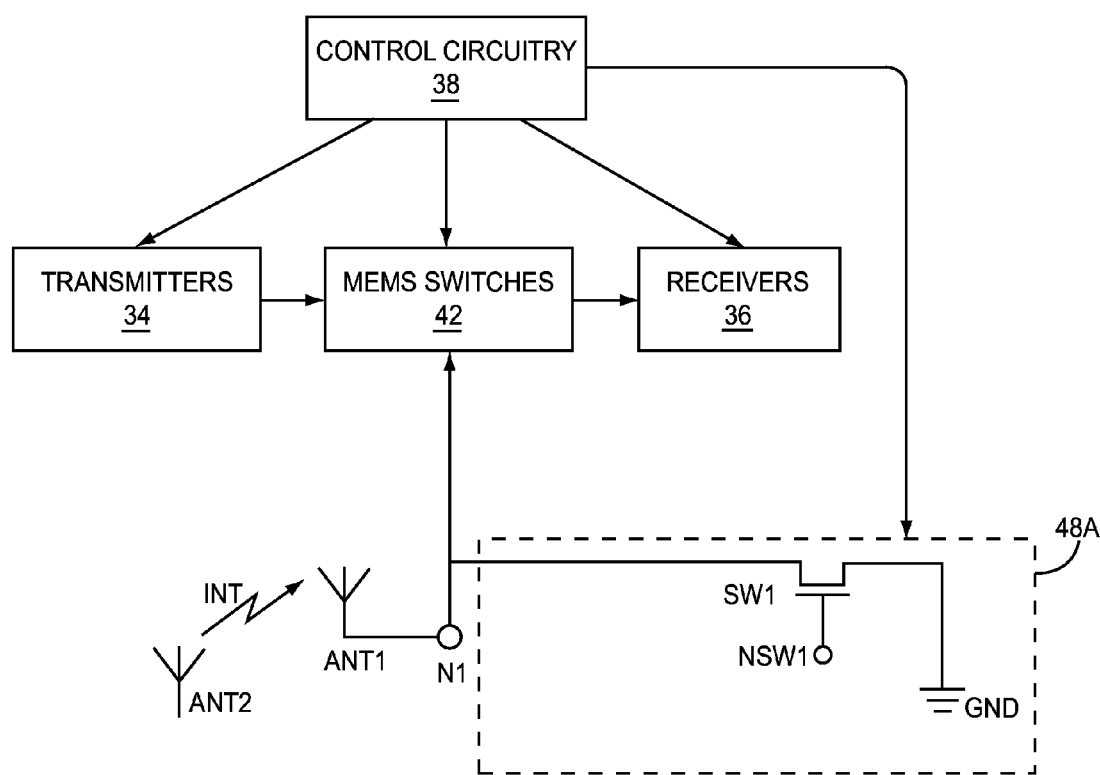
FIGS. 2A, 2B, and 2C illustrate a solid state pilot switch linking a hot node to a ground.

FIG. 2A illustrates a solid state pilot switch linking a hot node to a ground. Control circuitry 38 controls: transmitters 34, MEMS switches 42, receivers 33, and pilot switch circuit 48A. Control circuitry 38 may be logically organized into the following portions (not shown): transmitter control circuitry, MEMS switches control circuitry, receiver control circuitry, and pilot switch control circuitry. In the embodiment of FIG. 2A, a pilot switch circuit 48A includes a solid state pilot switch SW1 that links (connects) the hot node N1 to a ground GND. The solid state pilot switch SW1 is controlled by at least one control input node NSW1. Other embodiments of the pilot switch circuitry 48A are discussed later.

Hot node N1 is often called an "injection node," and may be linked to antenna ANT1, or to a cable input (not shown). Hot node N1 may or may not have voltage at any given time. Antenna ANT1 is subject to receiving transmissions or interference INT (shown as a lightning bolt icon) from second antenna ANT2. Second antenna ANT2 may belong to another device or may belong to the same device. In one embodiment, ANT1 is a cellular antenna and ANT2 is a WLAN (wide local area network) antenna, and both antennas are located in a single handheld communication device (this is a common configuration that causes many interference problems).

Figure 2B:
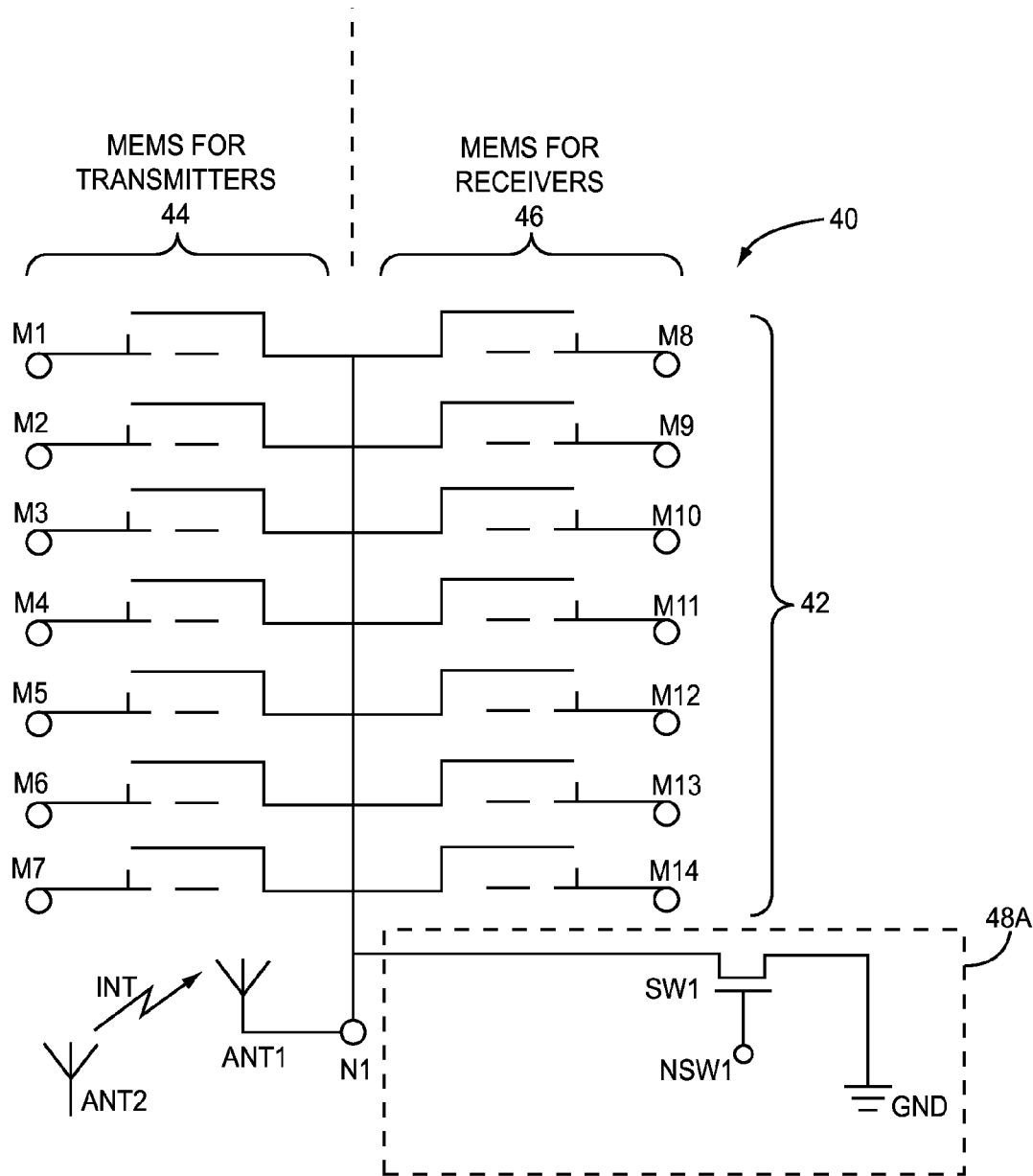

FIG. 2B illustrates exemplary MEMS switches 42 in more detail. Specifically, in FIG. 2B MEMS switches 42 include a SPNT (Single Pole, N Throw) switch set on a single die. In this case, there are 14 MEMS switches, so N=14, and this is a SP14T (single pole, 14 throw) switch set. The N1 node can be "thrown" to any of 14 nodes labeled M1 through M14. In one embodiment, a first set of MEMS switches 44 is linked to various cellular transmission circuits (see transmitters 34 in FIG. 2A), and a second set of MEMS switches 46 is linked to various cellular receiving circuits (see receivers 36 in FIG. 2A).

The proper use of the pilot switch SW1 in pilot switch circuitry 48A would be to close (change from a high impedance to a low impedance state) the pilot switch SW1 before a state change (open->close or close->open) of any of the connected MEMS switches (M1-M14). The pilot switch SW1 is controlled by node NSW1.

Figure 2C:
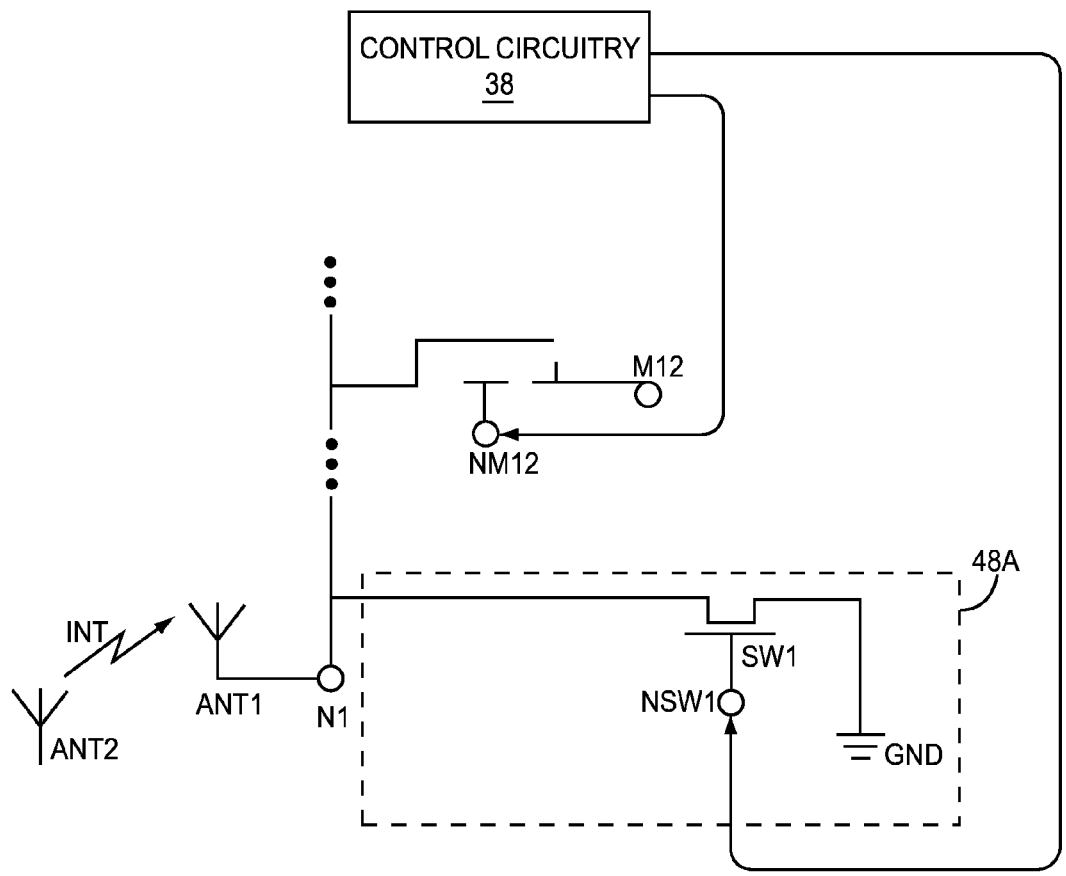

FIG. 2C illustrates control circuitry 38 controlling MEMS switch M12 through node NM12, and controlling pilot switch SW1 through control node NSW1.

Figure 3:
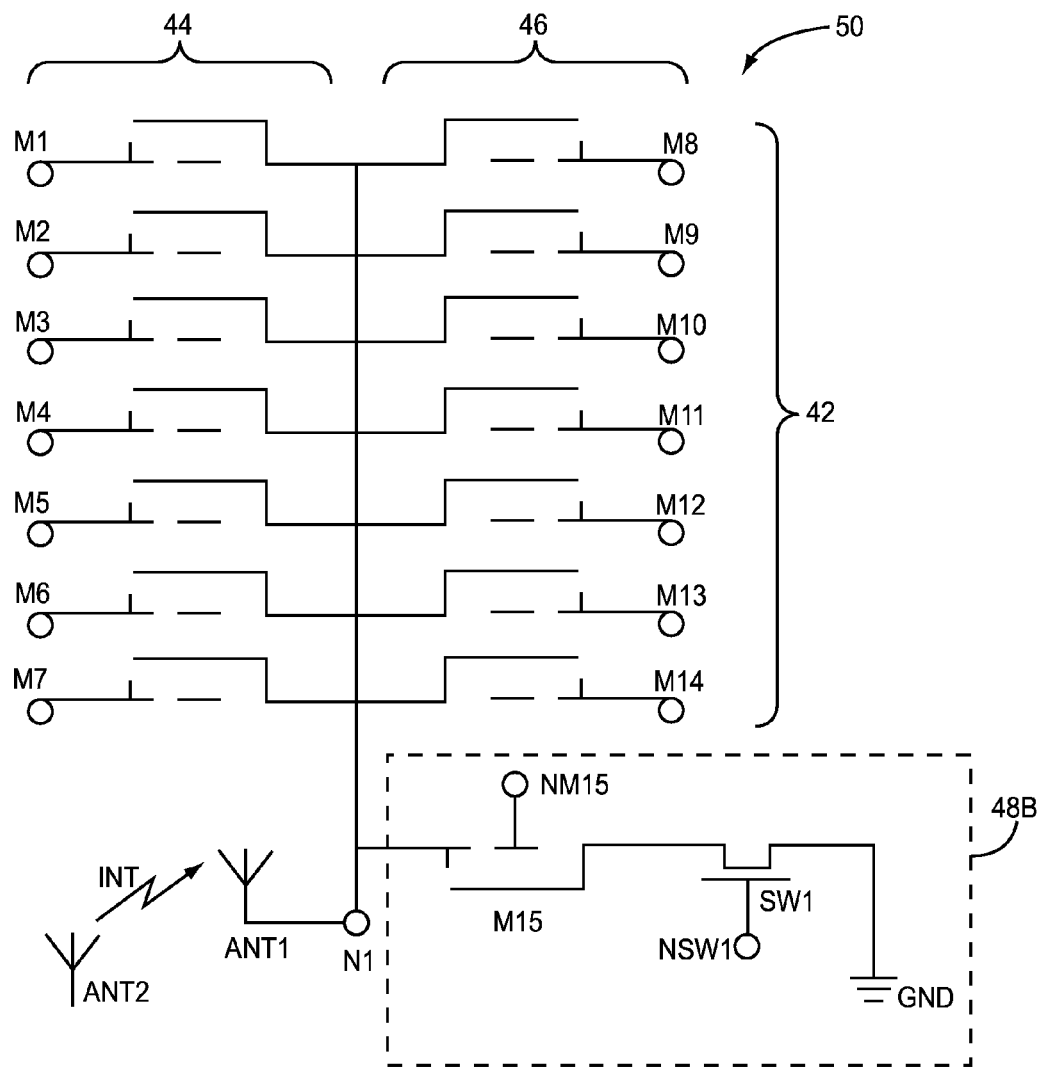
FIG. 3 illustrates a solid state pilot switch in series with a MEMS pilot switch, linking a hot node to a ground.

FIG. 3 illustrates a solid state pilot switch in series with a MEMS pilot switch, linking a hot node to a ground. FIG. 3 is identical to FIG. 2B, except that pilot switch circuit 48B includes a MEMS pilot switch M15 in series with solid state pilot switch SW1. The timing of these pilot switches will be discussed below in relation to other figures. The order of MEMS pilot switch M15 in series with solid state pilot switch SW1 may be reversed (not shown), so that the MEMS pilot switch M15 may be on the ground side of the solid state pilot switch. Further, a resistor (not shown) may be inserted into this series.

The addition of a MEMS pilot switch in series with the solid state pilot switch eliminates the negative impact of the OFF capacitance and limits the impact of the non-linearity of the solid state device. On the minus side, the total transition time required now includes 1.5 MEMS cycles plus 1 solid state switch cycle. Also, the MEMS pilot switch may be less protected from power incident on the common port.

Figure 4:
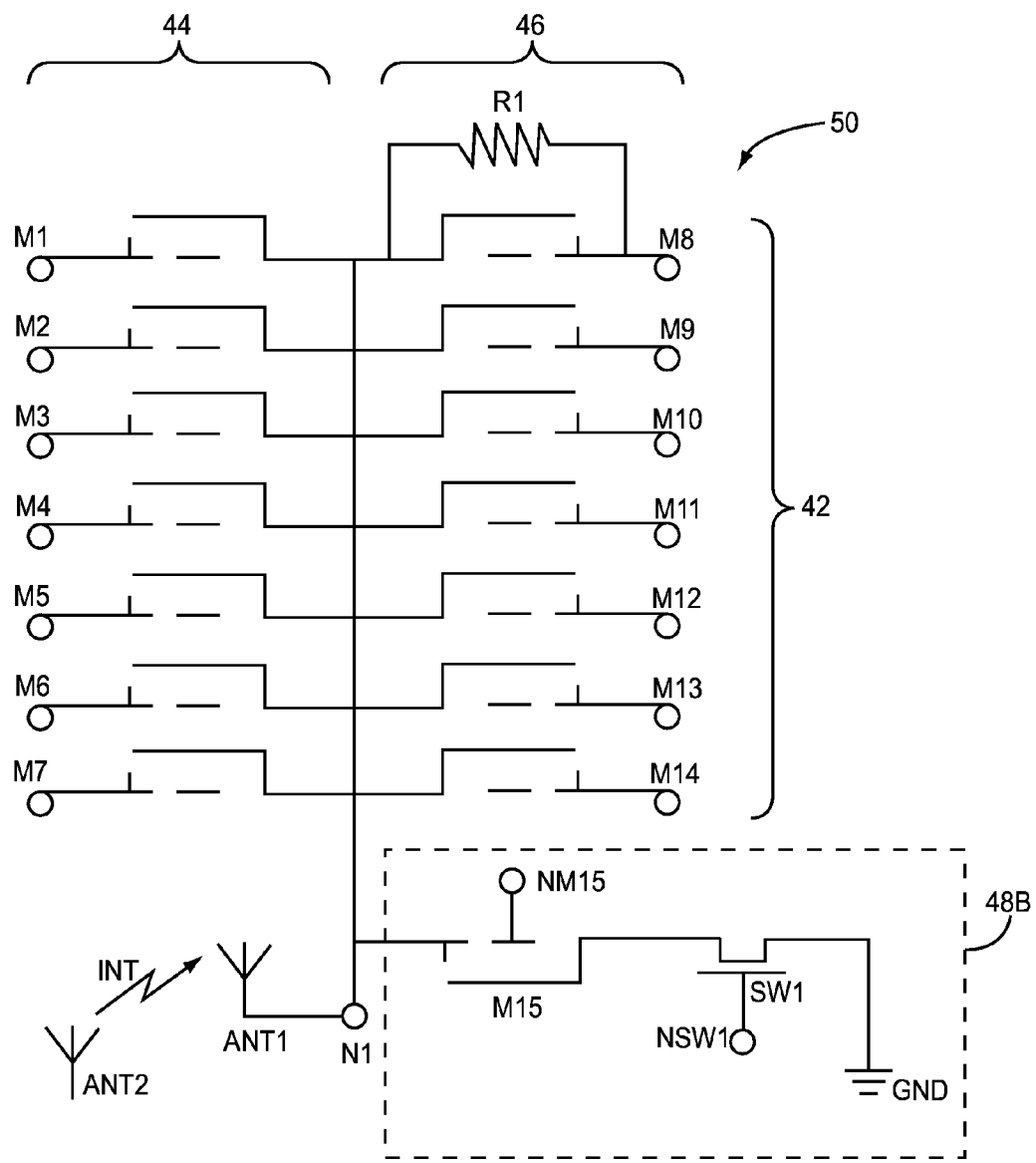
FIG. 4 illustrates a bypass resistor R1 in parallel with one of the MEMS.

FIG. 4 illustrates a bypass resistor R1 in parallel with one of the MEMS. FIG. 4 is identical to FIG. 3, except that a bypass resistor R1 has been placed in parallel with MEMS switch M8. A bypass resistor R1 may be used in combination with pilot switch circuitry such as 48B, or may be used by itself (not shown) without pilot switch circuitry.

Figure 5:
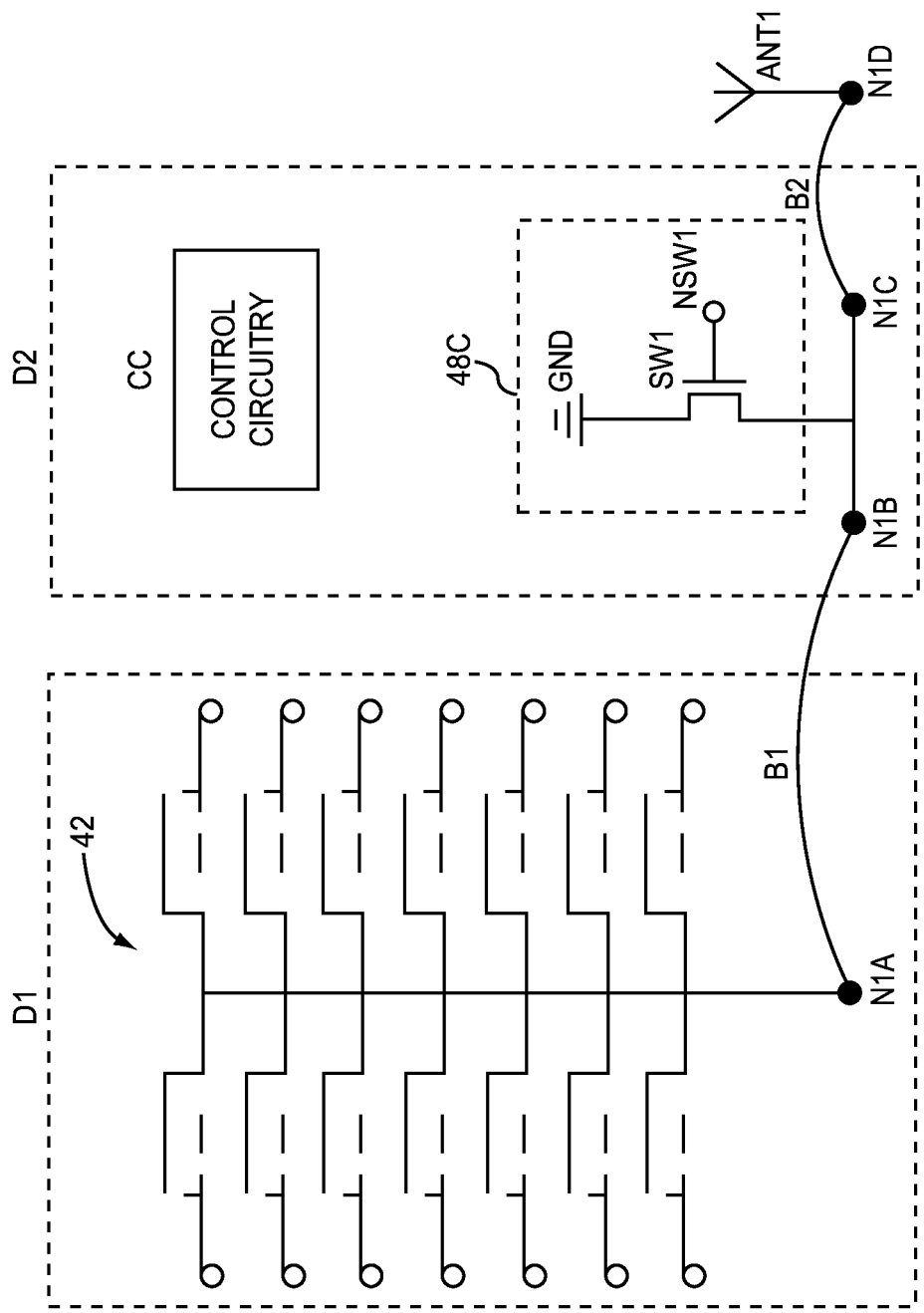
FIG. 5 illustrates a two die configuration.

FIG. 5 illustrates a two die configuration. In FIG. 5, a first die D1 includes a SP14T (Single Pole, 14 Throw) switch set 42 with 14 MEMS switches and a contact pad N1A. This is a common commercial die.

Die D2 includes pilot switch circuitry 48C (or 48B, not shown), and control circuitry CC for controlling the solid state pilot switch S21 (and optionally the MEMS pilot switch, not shown). Die D2 includes contact pads N1B and N1C.

Antenna ANT1 is linked to contact pad N1D.

In the two die configuration of FIG. 5, contact pads N1A and N1B are bonded together using bond wire B1, contact pads N1B and N1C are contacted together internally inside of die D2, and contact pads N1C and N1D are bonded together using bond wire B2.

After the bond wires are attached, contact pads N1A, N1B, N1C, and N1D all form a single hot node N1 (not shown).

In this embodiment, a single die D2 is conveniently inserted between the commercial SP14T die D1 and the antenna ANT1. This single die D2 contains both the pilot switch 48C and the associated control circuitry CC. Thus, this embodiment is very efficient to implement in production.

Figure 6:
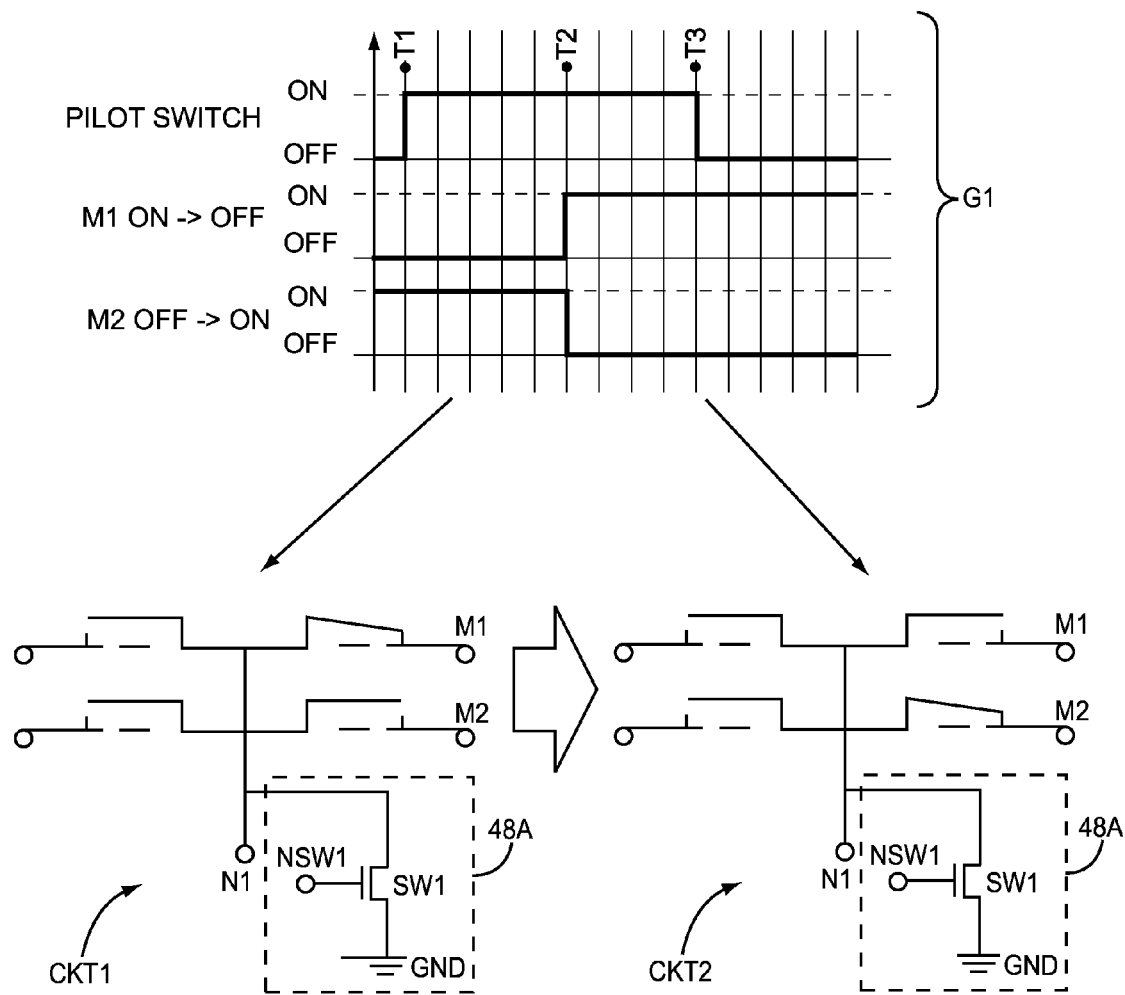
FIG. 6 illustrates simultaneous switching for two MEMS.

FIG. 6 illustrates simultaneous switching for two MEMS. The MEMS switch state transitions can be coincident or occur in any beneficial order. In FIG. 6, the MEMS switch transitions occur simultaneously. The order of MEMS switch transitions may be adjusted as required by an application, and all such variations are considered to be within the scope of the present disclosure.

Of course any number of switches attached to the hot node may transition in any particular order (or simultaneously) during the single pilot switch cycle (Off/On/Off). And of course it is also possible to use more than one pilot switch Off/On/Off cycle if needed or if it is advantageous to switch multiple MEMS switches.

In FIG. 6, a switching sequence illustrates simultaneous switching for two MEMS (M1 and M2) while pilot switch SW1 grounds hot node N1.

Graph G1 illustrates pilot switch SW1 turning on at time T1, thus grounding hot node N1. Switch M1 transitions from On to Off at time T2, and switch M2 transitions from Off to On simultaneously at time T2 (while the hot node N1 is grounded). Later, at time T3, the pilot switch SW1 turns off, and isolates hot node N1 from ground GND.

For example, before time T1, switch M1 may be connected to a transmission circuit (not shown), and may be conducting a transmission signal to an antenna (not shown) through hot node N1. After time T3, switch M2 may be connected to a receiving circuit (not shown), and may be conducting a received signal from an antenna (not shown) through hot node N1 to the receiving circuit (not shown). In other words, this switching sequence may represent a change from transmitting to receiving by a cellular telephone.

Alternatively, this switching sequence may represent: a change from receiving to transmitting by a cellular telephone; or a change from transmitting in a first band (through M1) to transmitting in a second band (through M2); or a change from receiving in a first band (through M2) to receiving in a second band (through M2). In all of these cases, grounding hot node N1 during the transitions of MEMS switches increases the lifespan of the MEMS switches.

Circuit CKT1 shows the MEMS switches before transitioning, and circuit CKT2 shows the MEMS switches after transitioning.

If the pilot switch 4A is replaced by a pilot switch that includes a solid state pilot switch and a MEMS pilot switch (as shown in pilot switch 48B in FIG. 4), then switching the pilot switch requires that both the solid state pilot switch and the MEMS switch are switched.

In one embodiment, switching pilot switch 48B (not shown) ON includes first switching the MEMS pilot switch ON, then switching the solid state pilot switch ON (this grounds hot node N1). While the hot node is grounded, other MEMS switches are transitioned, either simultaneously or sequentially. Switching the pilot switch 48B OFF includes first switching the solid state pilot switch OFF, then switching the MEMS pilot switch OFF (this isolates hot node N1 from ground).

Alternatively (not shown), the pilot switch may be turned ON, MEMS switch M1 transitioned, the pilot switch turned OFF, then the pilot switch may be turned ON, MEMS switch M2 transitioned, and the pilot switch turned off. This alternative is not very efficient from a timing point of view. It is more efficient to transition M1 and M2 simultaneously as shown in FIG. 6, or sequentially (but during a single cycle of the pilot switch) as shown in FIG. 7 below.

Figure 7:
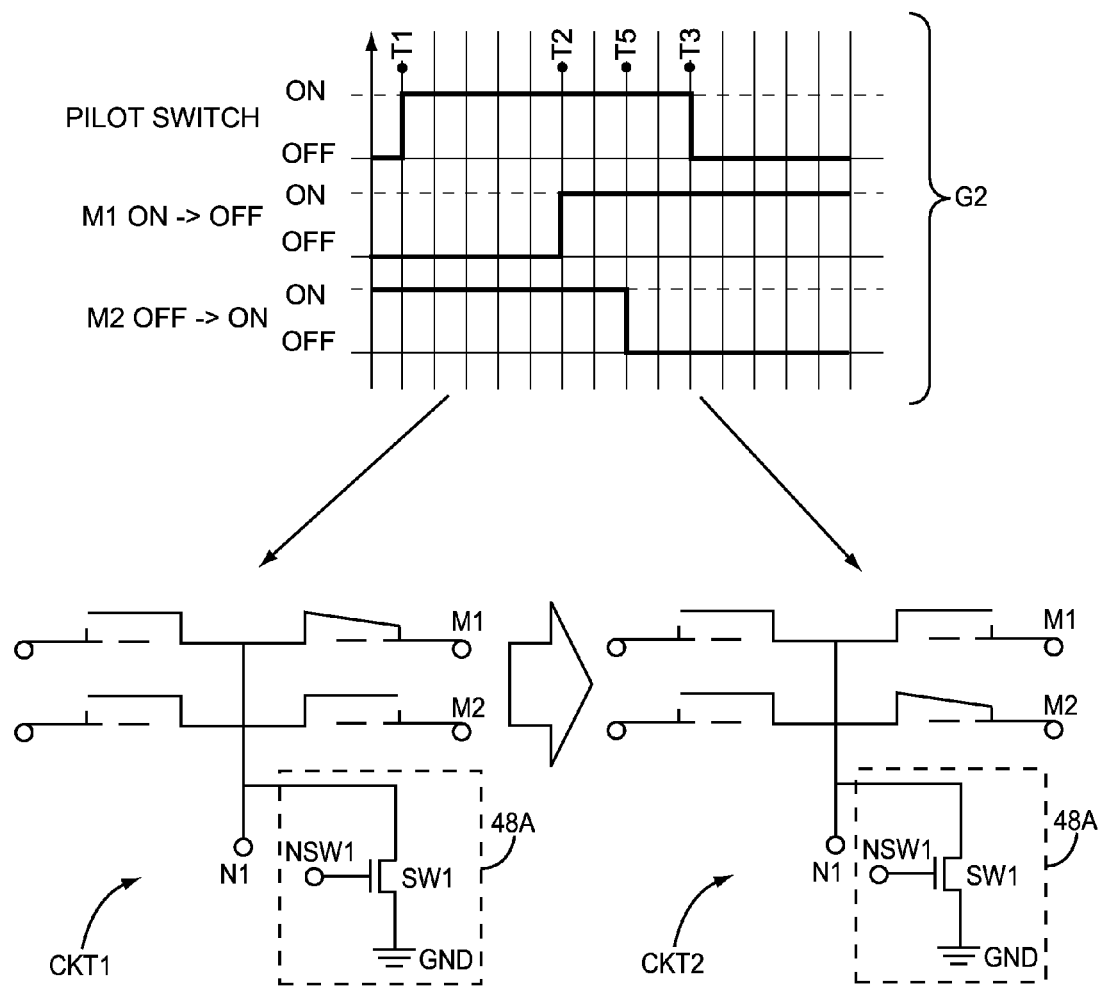
FIG. 7 illustrates sequential switching for two MEMS.

FIG. 7 illustrates sequential switching for two MEMS. FIG. 7 is identical to FIG. 6, except that MEMS switch M2 transitions from OFF to ON at time T5, and time T5 is different from time T2 (but during a single cycle of the pilot switch). Thus, switch M2 transitions sequentially with respect to switch M1 (and not simultaneously as shown in FIG. 6).

Sequential switching of the MEMS switches has some advantages in comparison to simultaneous switching. Sequential switching reduces the maximum switching power requirements, because only one switch must be transitioned at a time.

If the pilot switch 4A is replaced by a pilot switch that includes a solid state pilot switch and a MEMS pilot switch (as shown in pilot switch 48B in FIG. 4), then switching the pilot switch requires that both the solid state pilot switch and the MEMS switch are switched. One possible switching sequence for pilot switch 48B was discussed above in relation to FIG. 6.

Figure 8:
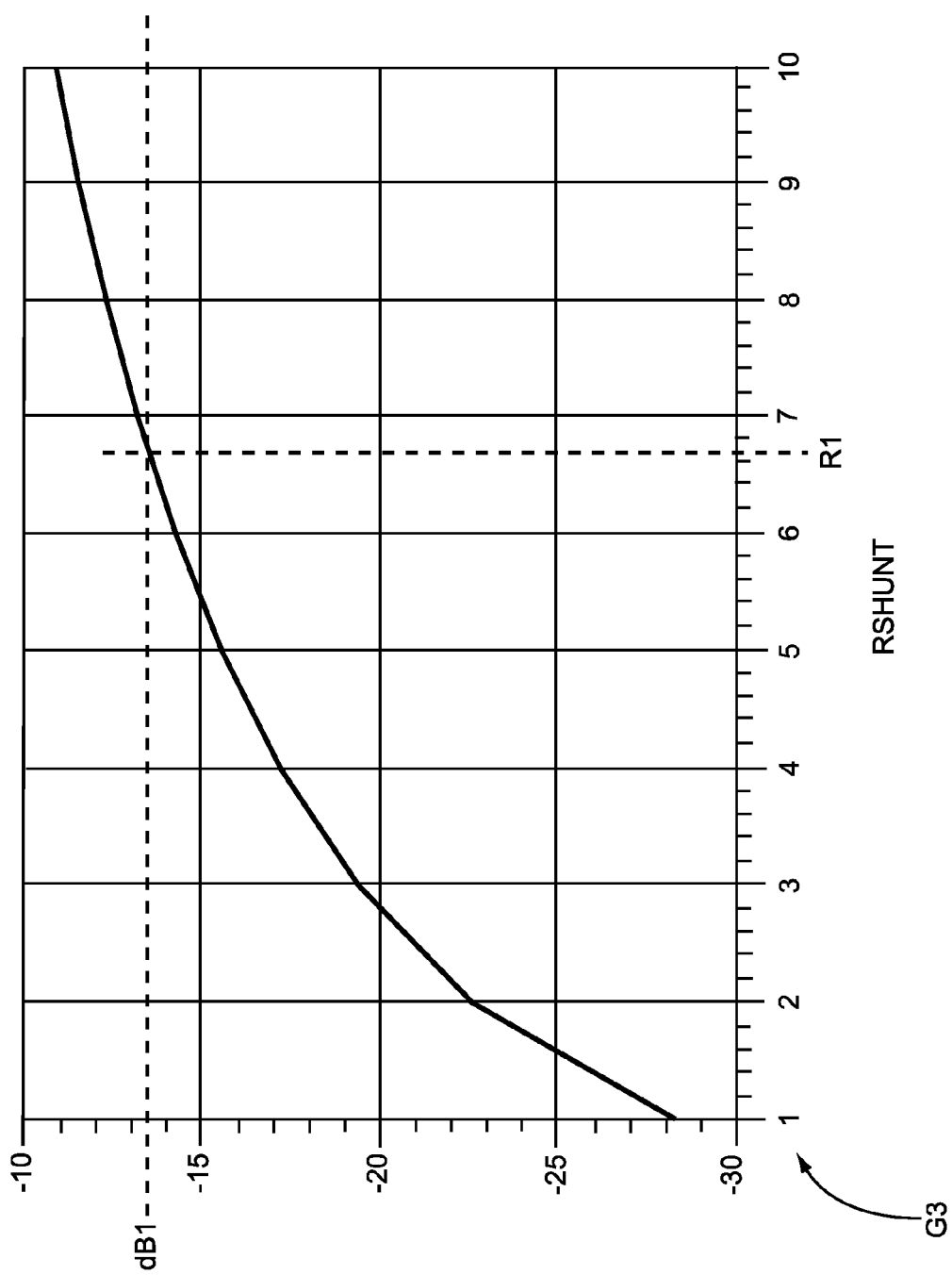
FIG. 8 illustrates exemplary calculations for a maximum resistance of the pilot switch.

FIG. 8 illustrates exemplary calculations for a maximum resistance of a pilot switch in a 50 ohm system, for a power reduction of 13.5 dBm.

Assuming that a cellular antenna receives 23.5 dBm peak power from a nearby WLAN antenna, and allowing a design maximum of 10 dBm to reach the SP14T MEMS switches through the hot node, means that the pilot switch must attenuate the WLAN signal by 13.5 dBm (23.5−13.5=10).

Graph G3 plots Gain versus Resistance Rshunt for a simulated circuit similar to FIG. 2. The gain reaches −13.5 (an attenuation of 13.5) at dB1, corresponding to a resistance R1 of 6.7 ohms. Thus, as a design parameter, the pilot switch should have a resistance of 6.7 ohms or less when ON (when grounding the hot node).

Figure 9A:
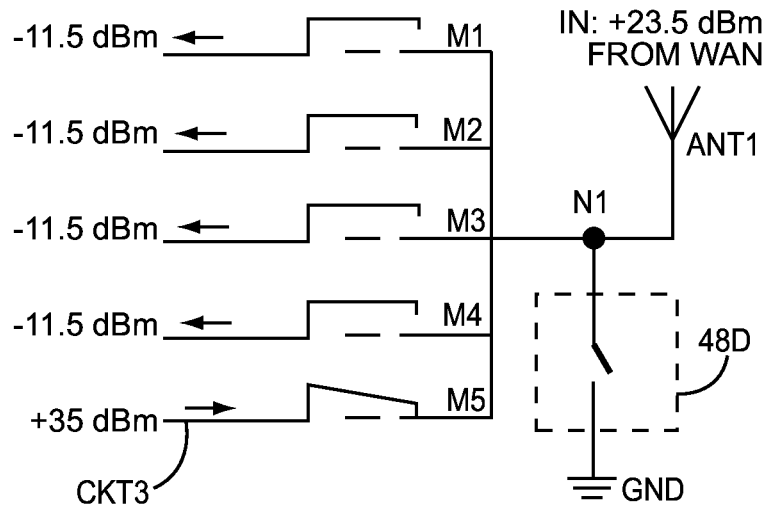
FIGS. 9A and 9B illustrate power flows effects due to a pilot switch.
Figure 9B:
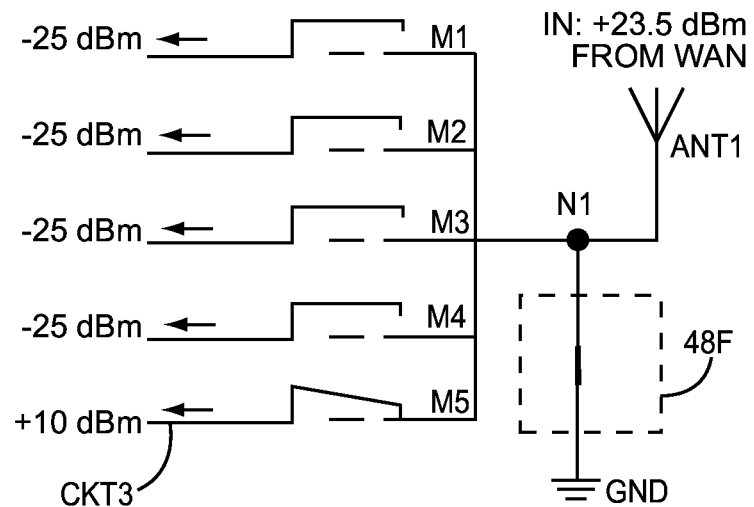

FIGS. 9A and 9B illustrate power flow effects due to a pilot switch.

In FIG. 9A, pilot switch 48D is open, antenna ANT1 receives 23.5 dBm from a nearby WAN antenna (not shown), transmission circuit CKT3 is transmitting at 35 dBm through MEMS switch M5.

In FIG. 9B, pilot switch 48F is closed (providing an attenuation of 13.5 dBm for a 6.7 ohms resistance to ground), antenna ANT1 receives 23.5 dBm from a nearby WAN antenna (not shown), and 10 dBm of power reaches MEMS switch M5.

Those skilled in the art will recognize improvements and modifications to the preferred embodiments of the present disclosure. All such improvements and modifications are considered within the scope of the concepts disclosed herein and the claims that follow. In the claims, the term "solid state switch" refers to any semiconductor device capable of acting as a switch, including, but not limited to: field effect transistors (FET), complementary metal oxide semiconductors (CMOS), and so forth.

What is claimed is:

1. Pilot switch circuitry for selectively shunting a hot node to a ground, the pilot switch circuitry comprising:
   a solid state pilot switch linking the hot node to the ground; and
   a first control input node configured to control the solid state pilot switch,
   wherein a first side of a first MEMS (microelectromechanical system) switch is connected to the hot node and a second side of the first MEMS switch is not grounded via a first additional pilot switch.

2. The pilot switch circuitry of claim 1, wherein the hot node is connected to at least one of: a first antenna or a first communication cable.

3. The pilot switch circuitry of claim 1, wherein the second side of the first MEMS switch is connected to a first communication circuit.

4. The pilot switch circuitry of claim 3, wherein the pilot switch circuitry further comprises:
   a MEMS pilot switch located in series with and adjacent to the solid state pilot switch.

5. The pilot switch circuitry of claim 4, wherein the MEMS pilot switch links the hot node to the pilot solid state switch, and wherein the pilot solid state switch links the MEMS switch to the ground.

6. The pilot switch circuitry of claim 4, further comprising: pilot switch control circuitry.

7. The pilot switch circuitry of claim 6, wherein the pilot switch control circuitry is configured to perform the following steps in the following order:
   close the MEMS pilot switch;
   close the solid state pilot switch;
   transition the first MEMS switch from a first state to a second state that is different from the first state;
   open the solid state pilot switch; and
   open the MEMS pilot switch.

8. The pilot switch circuitry of claim 4, wherein:
   the hot node is further connected to a first side of a second MEMS switch; and
   a second side of the second MEMS switch is not grounded via a second additional pilot switch.

9. The pilot switch circuitry of claim 8, wherein the second side of the first MEMS switch is connected to a first communication circuit configured for transmission, and wherein the second side of the second MEMS switch is connected to a second communication circuit configured for receiving.

10. The pilot switch circuitry of claim 8, further comprising:
    pilot switch control circuitry.

11. The pilot switch circuitry of claim 10, wherein the pilot switch control circuitry is configured to perform the following steps in the following order:
    close the MEMS pilot switch;
    close the solid state pilot switch;
    transition the first MEMS switch from a first state to a second state that is different from the first state, and substantially simultaneously transition the second MEMS switch from a third state to a fourth state that is different from the third state;
    open the solid state pilot switch; and
    open the MEMS pilot switch.

12. The pilot switch circuitry of claim 10, wherein the pilot switch control circuitry is configured to perform the following steps in the following order:
    close the MEMS pilot switch;
    close the solid state pilot switch;
    transition the first MEMS switch from a first state to a second state that is different from the first state;
    transition the second MEMS switch from a third state to a fourth state that is different from the third state;
    open the solid state pilot switch; and
    open the MEMS pilot switch.

13. The pilot switch circuitry of claim 12, wherein the hot node is connected to a cellular antenna.

14. The pilot switch circuitry of claim 4, wherein the solid state pilot switch links the hot node to the MEMS pilot switch, and wherein the MEMS pilot switch links the solid state pilot switch to the ground.

15. The pilot switch circuitry of claim 1, further comprising:
    pilot switch control circuitry.

16. The pilot switch circuitry of claim 15, wherein the pilot switch control circuitry is configured to perform the following steps in the following order:
    close the solid state pilot switch;
    transition the first MEMS switch from a first state to a second state that is different from the first state; and
    open the solid state pilot switch.

17. The pilot switch circuitry of claim 1, wherein:
    the hot node is further connected to a first side of a second MEMS switch; and
    a second side of the second MEMS switch is not grounded via a second additional pilot switch.

18. The pilot switch circuitry of claim 17, wherein the second side of the first MEMS switch is connected to a first communication circuit configured for transmission, and wherein the second side of the second MEMS switch is connected to a second communication circuit configured for receiving.

19. The pilot switch circuitry of claim 17, further comprising:
pilot switch control circuitry.

20. The pilot switch circuitry of claim 19, wherein the pilot switch control circuitry is configured to perform the following steps in the following order:
close the solid state pilot switch;
transition the first MEMS switch from a first state to a second state that is different from the first state, and substantially simultaneously transition the second MEMS switch from a third state to a fourth state that is different from the third state; and
open the solid state pilot switch.

21. The pilot switch circuitry of claim 19, wherein the pilot switch control circuitry is configured to perform the following steps in the following order:
close the solid state pilot switch;
transition the first MEMS switch from a first state to a second state that is different from the first state;
transition the second MEMS switch from a third state to a fourth state that is different from the third state; and
open the solid state pilot switch.

22. A two-die configuration comprising:
a pilot switch circuitry on a first die comprising:
a solid state pilot switch having a first end connected to a ground, a second end connected to a first contact pad and a second contact pad of the first die; and
a control portion connected to a first control input node;
control circuitry on the first die configured to control the solid state pilot switch through the first control input node;
a MEMS (microelectromechanical system) switch and a third contact pad on a second die, wherein the third contact pad is a hot node of the MEMS switch; and
a fourth contact pad,
wherein the pilot switch circuitry selectively shunts the hot node of the MEMS switch to the ground, the first contact pad is configured for wire bonding to the hot node of the MEMS switch, the second contact pad is configured for wire bonding to an antenna, the third contact pad is wire bonded to the first contact pad, and the fourth contact pad is wire bonded to the second contact pad.

* * * * *